United States Patent
Tarifa

(10) Patent No.: US 11,545,941 B2
(45) Date of Patent: Jan. 3, 2023

(54) ELECTRONIC SYSTEM OF ACTIVE POWER CONTROL FOR AUTOMOTIVE AUDIO AMPLIFIERS

(71) Applicant: Jose Mazini Tarifa, Sao Paulo (BR)

(72) Inventor: Fabio Tarifa, Sao Paulo (BR)

(73) Assignee: Jose Mazini Tarifa, Sao Paulo (BR)

( * ) Notice: Subject to any disclaimer, the term of this patent is extended or adjusted under 35 U.S.C. 154(b) by 0 days.

(21) Appl. No.: 16/819,305

(22) Filed: Mar. 16, 2020

(65) Prior Publication Data

US 2021/0265955 A1   Aug. 26, 2021

(51) Int. Cl.
*H03F 1/30* (2006.01)
*H03F 3/217* (2006.01)
*H04R 3/12* (2006.01)

(52) U.S. Cl.
CPC .......... *H03F 1/304* (2013.01); *H03F 3/2171* (2013.01); *H04R 3/12* (2013.01); *H03F 2200/03* (2013.01); *H04R 2499/13* (2013.01)

(58) Field of Classification Search
CPC .... H03F 1/304; H03F 3/2171; H03F 2200/03; H04R 3/12; H04R 2499/13
USPC ....................... 330/10, 251, 207 A
See application file for complete search history.

(56) References Cited

U.S. PATENT DOCUMENTS

| 3,898,532 A | 8/1975 | Frank |
| 6,683,494 B2 * | 1/2004 | Stanley ................. H03F 3/2175 330/10 |
| 6,940,981 B2 * | 9/2005 | Neunaber ................. H03F 1/52 381/55 |
| 10,826,441 B2 * | 11/2020 | Faulstich ................. H04R 3/02 |

FOREIGN PATENT DOCUMENTS

| CN | 1812653 | 8/2006 |
| CN | 200959659 | 10/2007 |
| JP | S64806 | 1/1989 |
| JP | 2000341047 | 12/2000 |

* cited by examiner

*Primary Examiner* — Hieu P Nguyen
(74) *Attorney, Agent, or Firm* — Defillo & Associates, Inc.; Evelyn A. Defillo

(57) ABSTRACT

A power control system for audio power amplifiers, especially in the automotive segment, dynamically controlling the output voltage through the reading of the input and output currents, and other parameters, automatically adjusting the amplifier to the load and to the operation conditions, allowing that the amplifier always operates within the safe operation range.

1 Claim, 4 Drawing Sheets

ELECTRONIC SYSTEM OF ACTIVE POWER CONTROL FOR AUTOMOTIVE AUDIO AMPLIFIERS

FIELD OF THE INVENTION

This invention deals with electronic systems, more specifically, with an electronic system of active power control for audio power amplifiers, especially in the automotive segment.

PRIOR ART

Due to the limited capacity of sound power of automotive CD players and multimedia centers, more powerful sound systems require the installation of one or more power amplifiers, which, on their turn, send the amplified signal to the loudspeakers.

Upon working with very high powers, an automotive amplifier may work in extreme conditions of heating due to the high circulating current and to the losses inherent to the system, in addition to be subject to inadequate or incorrect installations that lead to conditions of trip for overload or even damages to the product.

The loudspeakers connected to the output of the amplifiers represent the load that transforms the electric power into sound power, and one of the operational characteristics of the amplifiers to this electric transformation is impedance.

An amplifier is designed for a certain output impedance, measured in Ohms ($\Omega$), where it has its performance optimized due to its capacity of supply of voltage and electric current, and a "match" of the output impedance of the amplifier with the impedance resulting of the loudspeakers.

The use of an impedance other than that forecast to each case may cause overheating or even trip, as well as low performance, and risk of damages to the product. It is understood that an amplifier with minimum output impedance of $2\Omega$ may not work in a safe manner at $1\Omega$. On the other side, an amplifier of $1\Omega$ of minimum impedance drastically loses its performance upon being used at $2\Omega$.

It means that the manufacturer shall have versions of different products to the most common impedances resulting of the associations of loudspeakers. Mentioning the case of the impedances of $1\Omega$ and $2\Omega$, it leads to the existence of two versions of product that shall be manufactured, sold, and kept in stock of the vendor, store, or e-commerce to meet the client's applications.

Thus, this technical innovation, applicable to automotive amplifiers, allows to explore all power available in the amplifiers at the two impedances, and with no trip if it leaves the safe operation area, since the intelligence of the system is able to analyze the working situation and get adapted so that the amplifier is always within its safe operation range, and with no working interruptions caused by events of power overload and high temperature, with more strength and tolerance to user's errors, through the adoption of strategies of smart management of the input and output power.

Analysis of the State of the Art

Document JPS64806 reveals a device where the CPU reads data of DC voltage corresponding to the level of an audio signal entered, and data of a RAM control bias voltage, and sends them to a data buffer and a D/A converter. The data of DC voltage are temporarily stored in the memory and are sent to a programmable voltage source and the DC voltage source corresponding to the data of a power amplifier. Meanwhile, the data converted into D/A convert to generate the control bias voltage, and send them to a variable attenuator, linearly amplifying the input signal through the power amplifier and, as a consequence, the impedance of the incompatibility state does not occur in the output terminal of the amplifier.

The innovation proposed in JP2000341047 brings an audio power amplifier that has an amplifier circuit that amplifies the power of an audio signal to actuate a loudspeaker, a digital sequential circuit with a pulse signal externally provided for control of mute release, and a variable impedance circuit that gradually changes an impedance equivalent, in reply, to the step of the sequential circuit. This circuit of variable impedance is placed in a transmission path to the audio signal as a control gain element to guide the control of silent release through a pulse signal.

Patent CN1812653 shows a loudspeaker with variable impedance and power composed by the loudspeaker and its audio control switch, audio stop and output capacitor, diode, tube of the power amplifier with its collector and emitter, as well as base resistor, control switch of audio signal input, and capacitor of audio signal input. The mode of the said loudspeaker or receiver may be freely switched.

The lessons of CN200959659 bring an impedance loudspeaker, variable power amplifier, a power amplifier, and a control electric circuit composed by a loudspeaker specially designed through the utility model, and its audio control switch, an output capacitance and audio capacitor, a diode, a collector tube of power amplifier, emitter, and base resistors, a control switch of audio signal input, and a capacitor of audio signal input with electric connection on its turn. The utility model may be switched between the receiver and the loudspeaker in an arbitrary and convenient manner.

Document U.S. Pat. No. 3,898,532 reveals a transistor multichannel audio system where a protection circuit is provided, which protects the loudspeaker or another load device of each channel against damages, where the terminals carrying charging current of the power transistors are in short circuit and protect the transistors of the power amplifier from the damages caused by conditions of impedance of the loudspeaker unduly low, adding to the current limiting and/or dissipation circuits a protection circuit that disconnects the loudspeaker or another load device of the power amplifier under such conditions. The protection circuit preferably includes a bridge circuit in each channel which output voltage is a function of the current flow through the transistors of the power amplifier and of the value of the impedance of the loudspeaker or of the load device. It is achieved ranging the amplitude of the input voltage applied to the bridge circuit according to the variation in the charging current of the power transistor, and putting the load device so that the variation in its impedance varies the unbalance degree of the bridge circuit. A control circuit responds to a certain preset magnitude of the output voltage of the bridge, preferably disconnecting the loudspeakers or load devices from all channels. The control circuit also responds in a similar manner to abnormal voltage conditions in the circuit of the power amplifier resulting of the transistors of the power amplifier.

Thus, it is noticed that the prior arts pointed out do not anticipate the subject matter of this innovation, where an active power control electronic systems for automotive audio amplifiers keeps the amplifier within the safe operation range with the maximum power uniform within a wide range of impedances, using information of internal signals, current sensors, temperature sensors, and assistance of artificial intelligence.

DETAILED DESCRIPTION OF THE INNOVATION

This innovation deals with an electronic system of active power control for audio amplifiers, in order to keep the amplifier within the safe operation range, with tolerance to errors or excesses, and with maximum power uniform within a wide range of impedances, solving the inconveniences of the current techniques applied in the development and manufacturing of amplifiers, where we have specific models to each impedance and that may not operate in a reliable or efficient manner at impedances other than the design's.

The innovation also proposes to keep the operation of the amplifier even in most severe situations of load and temperature, where the full shutdown of the product naturally occurred, or eventually damages occurred to the internal electronic components of the product.

The system of this innovation guarantees the maintenance of the functionality and, at the same time, the integrity of the product when subject to situations that lead to the trip or even full collapse in conventional amplifiers.

In practice, it allows:

a) to keep only one model that meets two applications (1Ω and 2Ω, for example), simplifying the logistics of manufacturing, distribution, and sale, exempting to keep two versions of a same product in stock;

b) more freedom to the consumer to make update or change of the loudspeakers for other models or impedances with no need of replacing the amplifier;

c) safer working and with no shutdown even when in most severe conditions, since the proposed system controls the maximum capacity of the amplifier avoiding overloads that may lead to trip even to damages to the internal circuits;

d) better yield, with effective use of the power peaks;

e) more strength to the amplifier with the inclusion of continuous monitoring of the signals and of the environmental conditions, since in addition to the input and output power, we have the monitoring of the temperature of operation, keeping the product in operation through the gradual reduction of the power made in an automatic manner;

f) tolerance to common errors of installation, such as, for example, excess of level of input, incorrect impedance, poor ventilation, etc.

Figure 1:
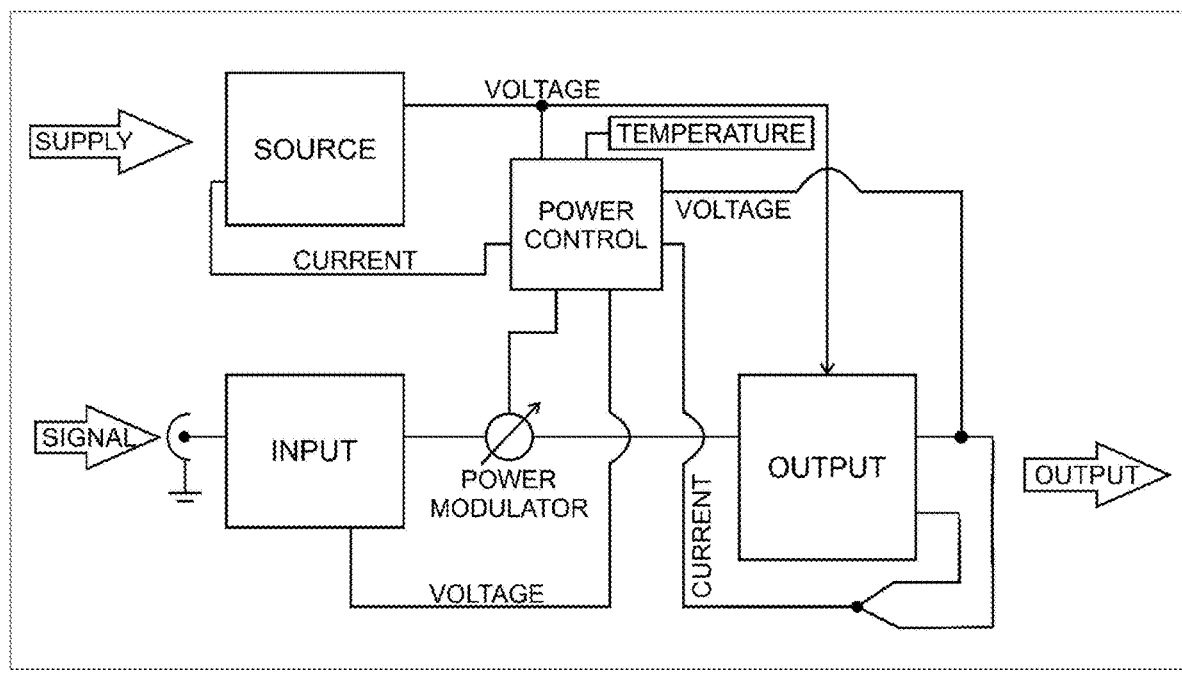
FIG. 1 represents a block diagram of the system of this innovation, where we see the main input, output, and control blocks.

A power amplifier works so that a low level and low power signal is amplified. Thus, in the output of this amplifier, there is a signal with power a lot higher than the input signal. It is formed by the following functional blocks, represented in FIG. 1:

a) signal input, where the signals from a CD player or multimedia center enter, which may include some adjustments such as gain, high pass filters, low pass filters, and equalizations;

b) power supply, which has the function of increase the input voltage (normally 12V DC of batteries) to a higher level that allows the supply of the wanted power to the output stage;

c) output stage, which makes the conversion of the energy delivered by the power supply into high-power audio signal.

The ideal output signal is a true copy of the input signal, but amplified many times in voltage, and with high capacity of current, so obtaining high sound power, which on its turn is delivered to the load, in such case, the loudspeakers of the system.

That is, a power amplifier delivers energy to a load, controlled by a low-power input signal. But there is a limit of the maximum power that it is able to deliver to the load or that is able to convert from power from the internal power supply. Normally, such limits are fixed and lead to the trip of the amplifier if they are exceeded (overloads), but, not always they are sufficient to avoid damages to the product itself or to the installations.

Figure 3:
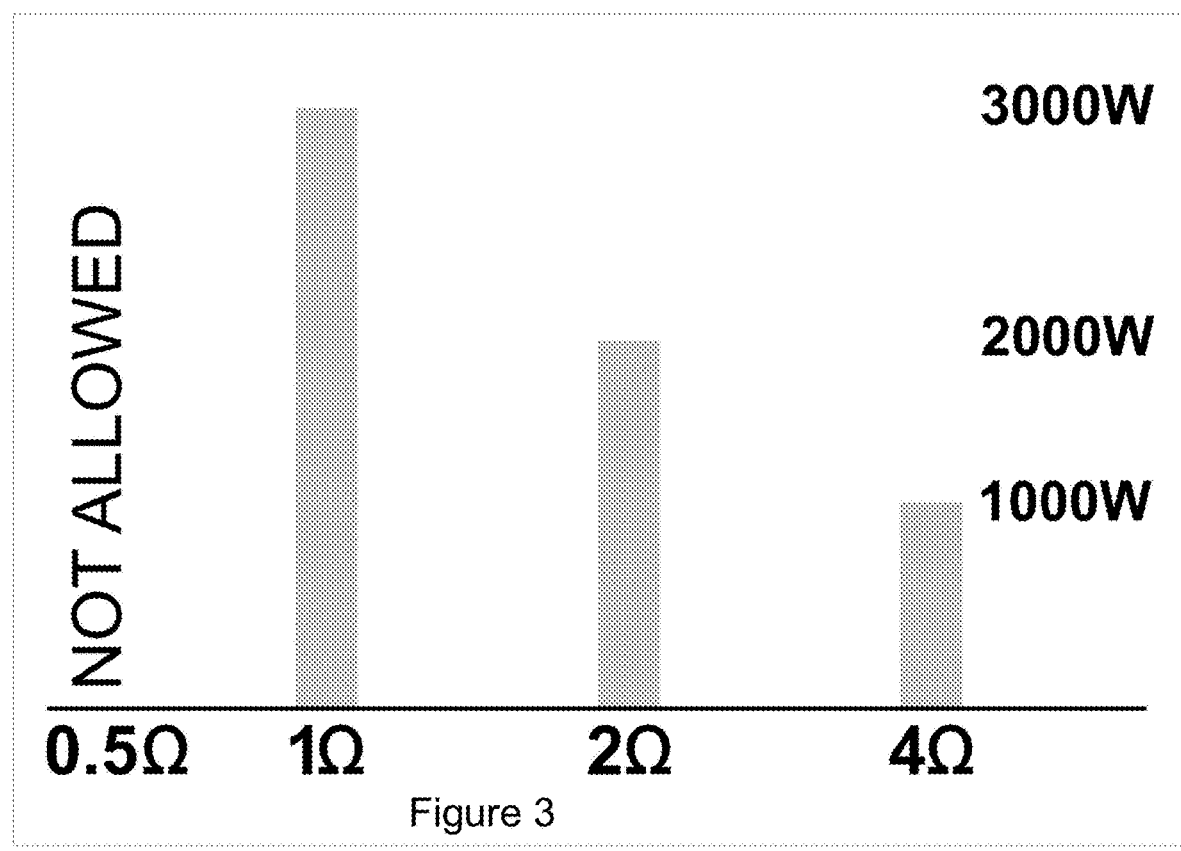
FIG. 3 illustrates the relationship between maximum power and impedance in a conventional amplifier of 1Ω.

For example, FIG. 3 brings a graph that illustrates the relationship between maximum power and impedance in a conventional amplifier of 1Ω of output impedance, where the maximum power is only achieved at such impedance. Thus, the yield at higher impedances is reduced, and the operation at lower impedances is not allowed, due to the risk of overload or shutdown by actuation of the protections.

Figure 4:
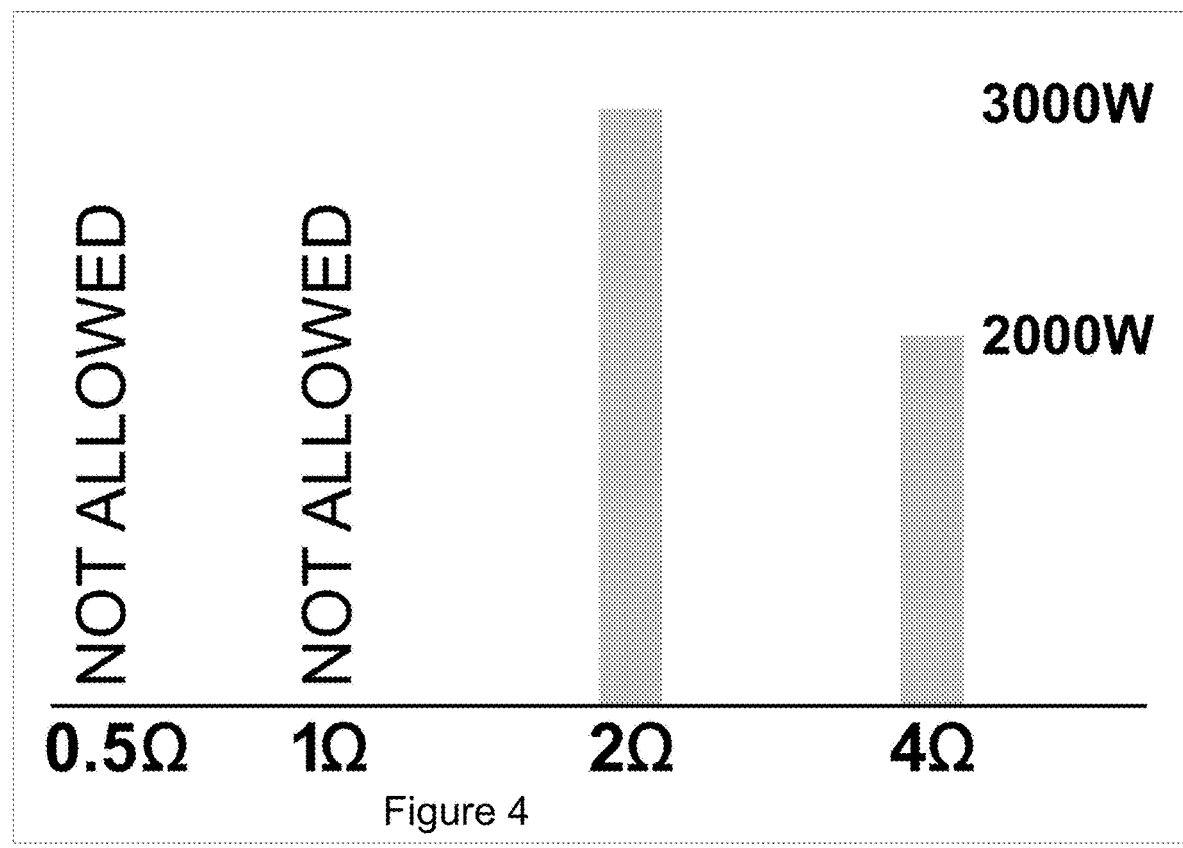
FIG. 4 illustrates the relationship between maximum power and impedance in a conventional amplifier of 2Ω.

FIG. 4 brings a graph that exemplifies the relationship between maximum power and impedance in a conventional amplifier of 2Ω of output impedance, where the maximum power is only achieved at such impedance. Thus, the yield at higher impedances is reduced, and the operation at lower impedances is not allowed, due to the risk of overload or shutdown by actuation of the protections.

Figure 5:
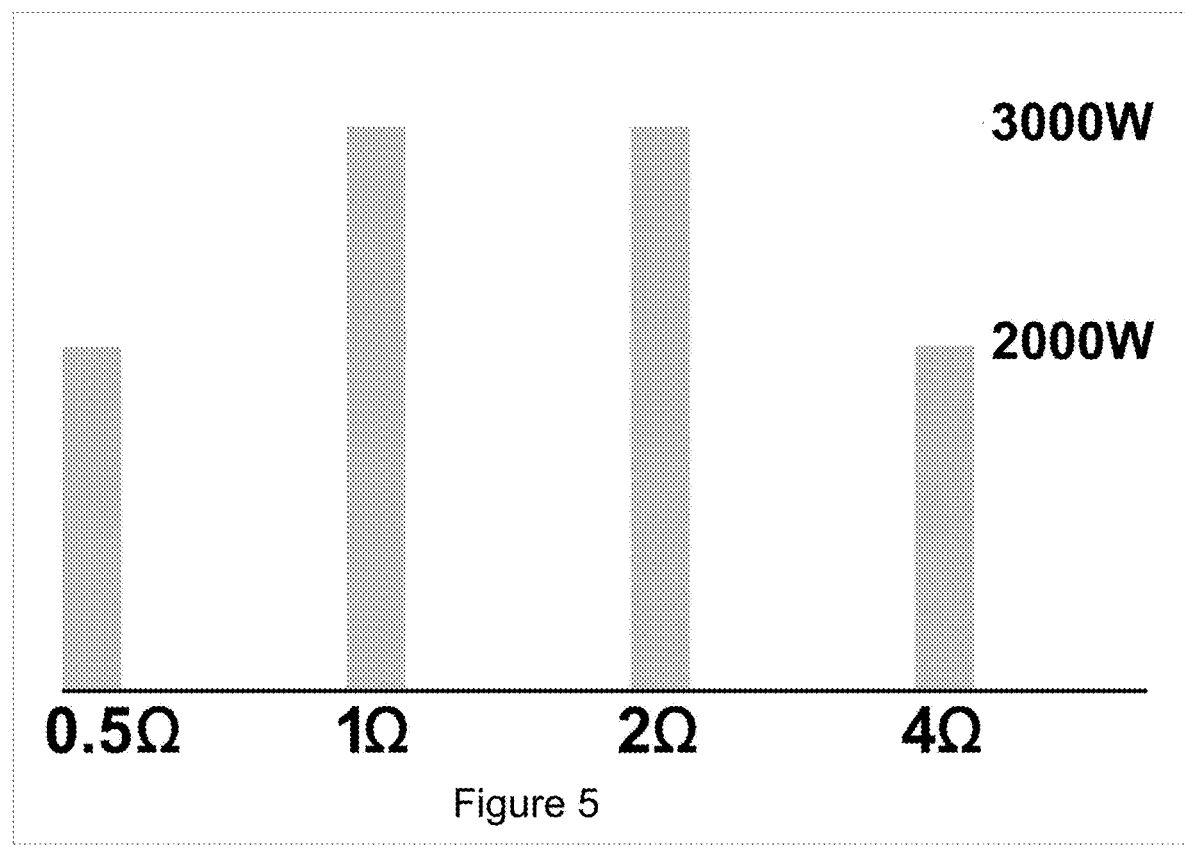
FIG. 5 illustrates the relationship between maximum power and impedance in an amplifier in the innovative system proposed herein.

FIG. 5 brings a graph that exemplifies the relationship between maximum power and impedance in an amplifier in the innovative system proposed herein, where the maximum power is only achieved at two impedances and is continuous in such interval, allowing that the amplifier still operates at lower impedances with no risks of damages for overloads, and with no undesired shutdowns.

As the impedance of the load has direct relationship with the current and with the output voltage of the amplifier, it is required that, to a same output power, but with different impedances of loudspeakers, one shall choose between versions of the same product with different output voltage (proper to each impedance).

The system of this innovation solves the question above, since the output voltage is controlled in a dynamic manner through the reading of the input and output currents and other parameters, such as, temperature, automatically adjusting the amplifier to the load and/or to the operation conditions, so allowing that a single product meets a larger range of impedances, and always operates within the safe working range.

The output power control is made through the adjustment of the maximum output voltage of the amplifier, being adapted to the operation condition of the time, and it is automatically made, based on the reading of the gathered information of: (i) input voltage, (ii) input current, (iii) output voltage, (iv) output current, (v) temperature of the heat sink, and (vi) proportion of the adjustment of the output signal.

Figure 2:
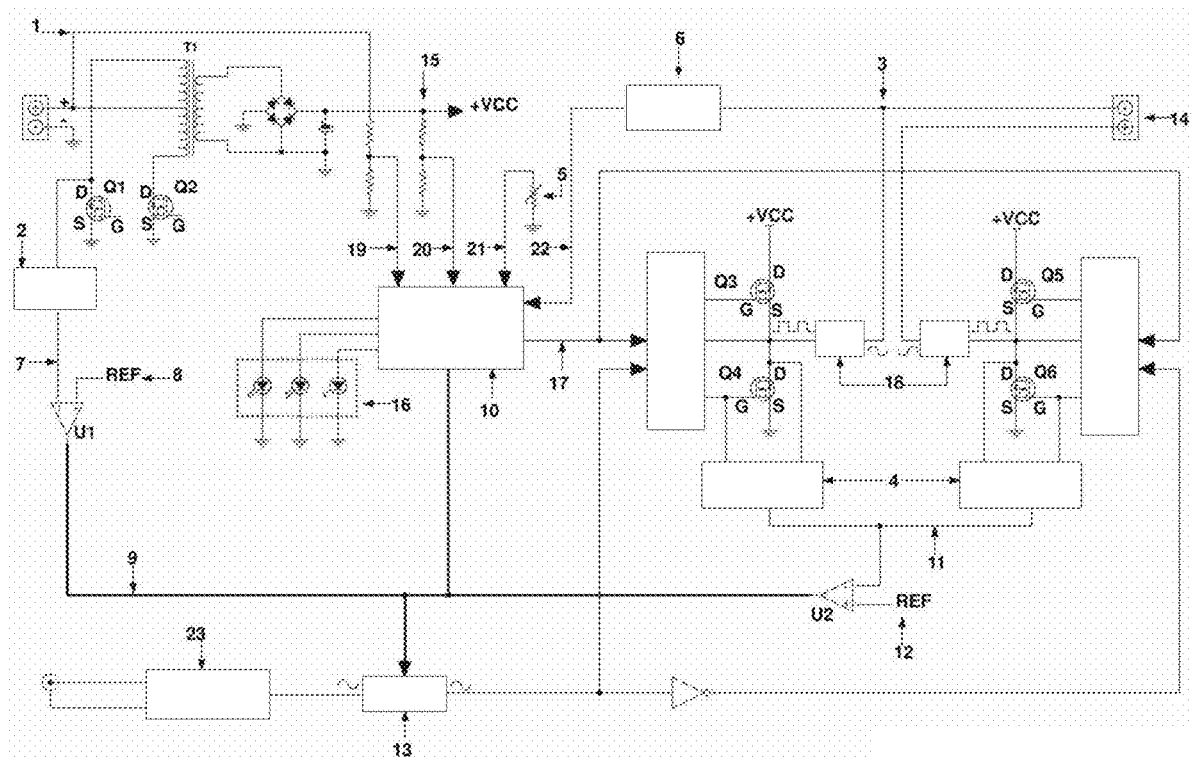
FIG. 2 represents the general scheme of the components of the system proposed herein.

The dynamic control of the output voltage of the amplifier by the system proposed herein, which FIG. 2 brings the scheme representation of the connection between its components, guarantees that the amplifier always operates within the power range it was designed to, in a larger range of output impedances, in a safe manner, drastically reducing the chance of tripping, even in adverse conditions.

For such, it is made the measurement of samples of the signals of input voltage (19), voltage of the inner source (20), and temperature of the sink (21), through ADC (Analog to Digital Converter) conversion, which transforms the read signals into binary values proper for the internal computational processing, and treatment of the information, internally made in the micro-controller (10) together with the analysis of the information from the clipping detection circuit (22).

The power supply of an amplifier is basically composed by a magnetic element, the transformer (T1), and electronic switches (Q1 and Q2) that switch thousands of times per second. The switching of such switches creates an alternate magnetic field in the transformer (T1), and by the induction effect the energy is transferred between its windings with increase of the voltage, resulting in the secondary voltage +VDC (15).

The electronic switches (Q1 and Q2) are Mosfet transistors, or MOS transistors of field effect, which present high speed of switching and low losses. However, every Mosfet has an internal resistance extremely low, of some milliohms (m$\Omega$).

The internal resistance of Mosfet of the source is used to determine the input current, since the passage of the current through a resistance generates a difference of potential between the "drain" and "source" terminals, known as VDS—drain-source voltage, which exists in the "ON" mode of Mosfet.

Such VDS voltage, read by the current sensor of the source (2), is directly proportional to the current that flows through the switches (Q1 and Q2), developed at the time of ON state, and is compared to a voltage reference (8) in a voltage comparison equipment (U1) that is physically connected to the control busbar (9), which informs the clipping circuit (13) the need of attenuating the signal that will be send to the output stage.

Figure 6:
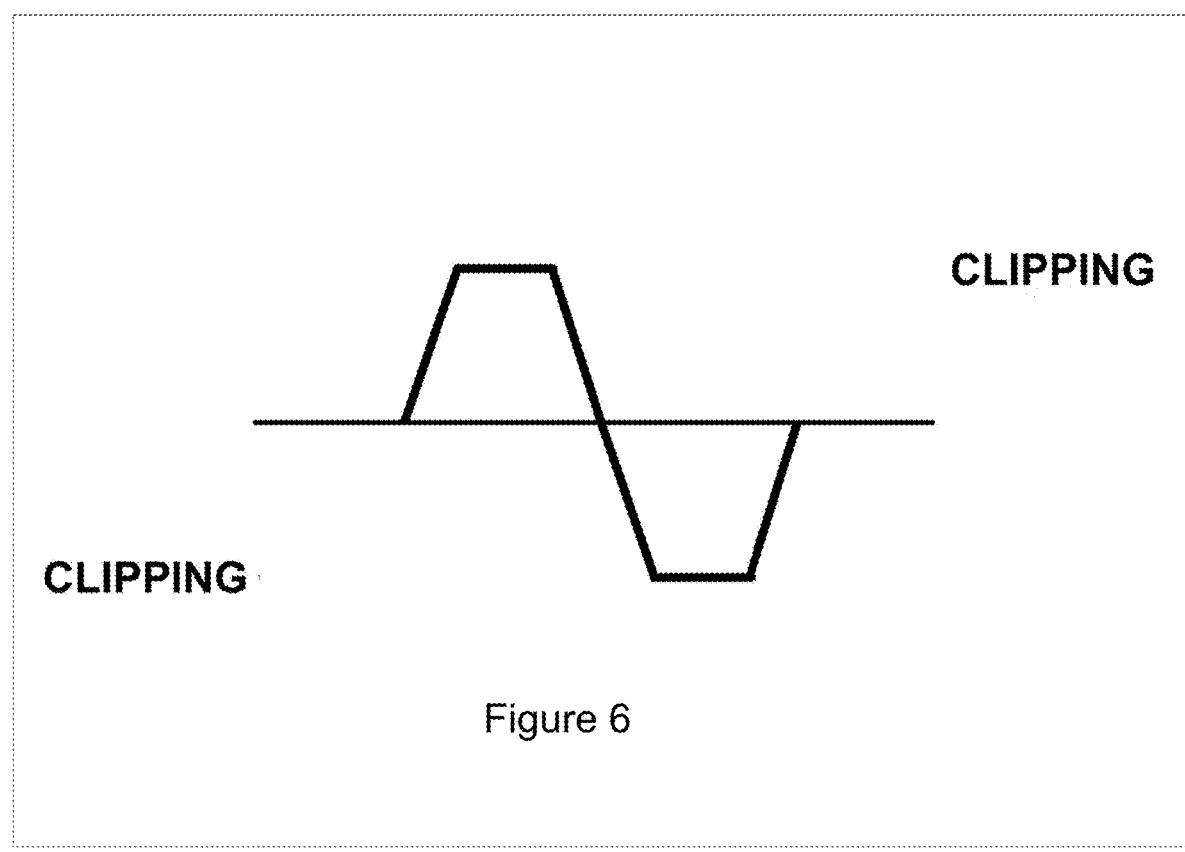
FIG. 6 illustrates the output signal when it reaches the clipping point, with the adjustments in the top and bottom ends of the wave.

The measurement of output voltage (3) and clipping of the signal is made by a clipping detection circuit (6) that sends a signal (22) to the micro-controller (10) reporting that the output signal achieved the voltage level of the inner source (15) and passed to go through a distortion or adjustment of the signal known as clipping, as showed in FIG. 6. The operation of the amplifier in such clipping region is indicated through the LEDs (16) and, if the length of stay in such clipping situation is excessive, the control mode is activated by the micro-controller (10).

The measurement of the output current is made similarly to the method used in the measurement of the input current, through current sensors (4) that use the read VDS voltage of the Mosfets Q4 and Q6. The output stage is class D, which is a system of energy conversion made through pulse width modulation (PWM) of a high frequency carrier, where we have a full bridge arrangement of Mosfets (Q3, Q4, Q5, Q6) acting as switches that control the current to be sent to the load through PWM, there being and LPF filter (18) that recomposes the audio signal from the PWM carrier. The VDS voltage (11), proportional to the current that flows in the Mosfets read by the current sensors (4), is compared to a voltage reference REF (12) in a voltage comparison equipment (U2) physically connected to the control busbar (9), informing to the clipping circuit (13) the need of attenuating the signal that will be sent to the output stage whenever the signals sent by the current sensors (4) exceed the defined threshold reference REF (12).

The measurement of temperature is made by a thermal sensor (5), strategically placed in order to measure the temperature of the heat sink of the product, there being an analogical-digital converter (ADC) inside the micro-controller (10) that makes the reading and interpretation of the values (21), thus, it may properly attenuate the level of the output signal whenever the operation temperature is outside the recommended standards.

The control busbar (9) makes the interconnection between the modules and the blocks of the system of this innovation, gathering the electric signals that define the actuation of the power control.

A clipping circuit consists of a limiter (13) that makes the control of the signal level, modulated by the control busbar (9).

Automatically, the signal level that comes from the audio input stage (23) is processed by the limiter (13) and varies according to the control strategy of the system, with limit of the maximum level of output signal (14) and, consequently, of the power itself delivered to the load dynamically keeping within the preset limits, clear purpose of the innovative system proposed herein.

In laboratory and field tests, the conditions potentially destructive were duly mapped and are addressed with the assistance of artificial intelligence in the firmware that runs in the micro-controller (10). Such algorithms detect the operation conditions through the reading of the information of input voltage (1), source voltage (15), temperature (5), detection of clipping of the signal (6), and reading of the status (17) of the Class D output stages, communicating with the control busbar (9).

If the information of the operation conditions aforementioned indicate failures or behavior outside the system's control, such as short circuit in the load connected to the output (14), discharged battery or battery with voltage over the allowed limit, or excessive temperature for failure/ obstruction of ventilation, the system makes a series of attempts to reestablish the operation. However, if the cause of the failure persists, the algorithm passes to consider the failure as permanent, and the system signalizes the cause of the failure through LEDs (16), expecting for the user's intervention.

In summary, the proposed system makes the dynamic and automatic control of the output voltage of the amplifier so that, through it, it is able to keep the output power within the specifications and in a safe manner, automatically adjusting the amplifier to the load and/or to the operation conditions.

This innovation is not limited to the representations commented or illustrated herein, having to be understood in its wide scope. Many modifications and other representations of the invention will spring to the mind of those knowledgeable in the technique this innovation belongs to, having the benefit of the instruction presented in the previous descriptions and attached drawings. Additionally, it shall be understood that the invention is not limited to the specific form revealed, and that modifications and other forms are understood as included within the scope of the claims attached. Although specific terms are herein deployed, they are used in a generic and descriptive manner only, and not with the purpose of limitation.

The invention claimed is:

1. An electronic system of a power active control for an automotive audio amplifier comprising:
- a micro-controller;
- an audio input source connected to the microcontroller;
- a power source connected to the microcontroller, the power supply source including a current sensor, a magnetic transformer and mosfet transistors;
- a heat sink connected to the microcontroller, the heat sink including a thermal sensor to measure a temperature of the heat sink;
- a clipping detection circuit connected to the microcontroller;
- where the micro-controller includes a firmware provided with an artificial intelligence including algorithms which transform into binary reading values, the readings of the input voltage, the source voltage, the temperature, the signals of the clipping detection circuit, and a reading of the status (17) of class D output stages, communicating with a control busbar (9).

* * * * *